(12) United States Patent
Sebot et al.

(10) Patent No.: US 11,537,375 B2
(45) Date of Patent: Dec. 27, 2022

(54) DIGITALLY COORDINATED DYNAMICALLY ADAPTABLE CLOCK AND VOLTAGE SUPPLY APPARATUS AND METHOD

(71) Applicant: Intel Corporation, Santa Clara, CA (US)

(72) Inventors: Julien Sebot, Portland, OR (US); Edward A. Burton, Hillsboro, OR (US); Nasser A. Kurd, Portland, OR (US); Jonathan Douglas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 622 days.

(21) Appl. No.: 16/550,134

(22) Filed: Aug. 23, 2019

(65) Prior Publication Data

US 2021/0055921 A1 Feb. 25, 2021

(51) Int. Cl.
*G06F 1/00* (2006.01)
*G06F 8/41* (2018.01)
*H03L 7/08* (2006.01)
*G06F 9/30* (2018.01)
*G06F 15/76* (2006.01)

(52) U.S. Cl.
CPC ........ *G06F 8/4442* (2013.01); *G06F 9/30047* (2013.01); *H03L 7/08* (2013.01); *G06F 2015/765* (2013.01)

(58) Field of Classification Search
CPC .............. G06F 8/4442; G06F 9/30047; G06F 2015/765; G06F 1/324; G06F 1/3243; G06F 1/3296; G06F 9/3824; H03L 7/08; H03L 7/087; H03L 7/104; Y02D 10/00
See application file for complete search history.

(56) References Cited

U.S. PATENT DOCUMENTS

| 2002/0083356 | A1 | 6/2002 | Dai |
| 2004/0117678 | A1 | 6/2004 | Soltis et al. |
| 2015/0355700 | A1* | 12/2015 | Pusukuri ................. G06F 1/324 713/323 |
| 2017/0177057 | A1 | 6/2017 | Morning-Smith et al. |
| 2017/0329391 | A1 | 11/2017 | Jaffari et al. |

FOREIGN PATENT DOCUMENTS

WO 2006135936 12/2006

OTHER PUBLICATIONS

International Search Report & Written Opinion dated Oct. 15, 2020 for PCT Patent Application No. PCT/US2020/040511.

\* cited by examiner

Primary Examiner — Xuxing Chen
(74) Attorney, Agent, or Firm — Schwabe, Williamson & Wyatt, P.C.

(57) ABSTRACT

An apparatus and method is described that digitally coordinates dynamically adaptable clock and voltage supply to significantly reduce the energy consumed by a processor without impacting its performance or latency. A signal is generated that indicates a long latency operation. This signal is used to reduce power supply voltage and frequency of the adaptable clock. An early resume indicator is generated a few nanoseconds before normal operations are about to resume. This early resume signal is used to power up the power-downed voltage regulator, and/or can increase frequency and/or supply voltage back to normal level before normal processor operations are about to resume.

17 Claims, 6 Drawing Sheets

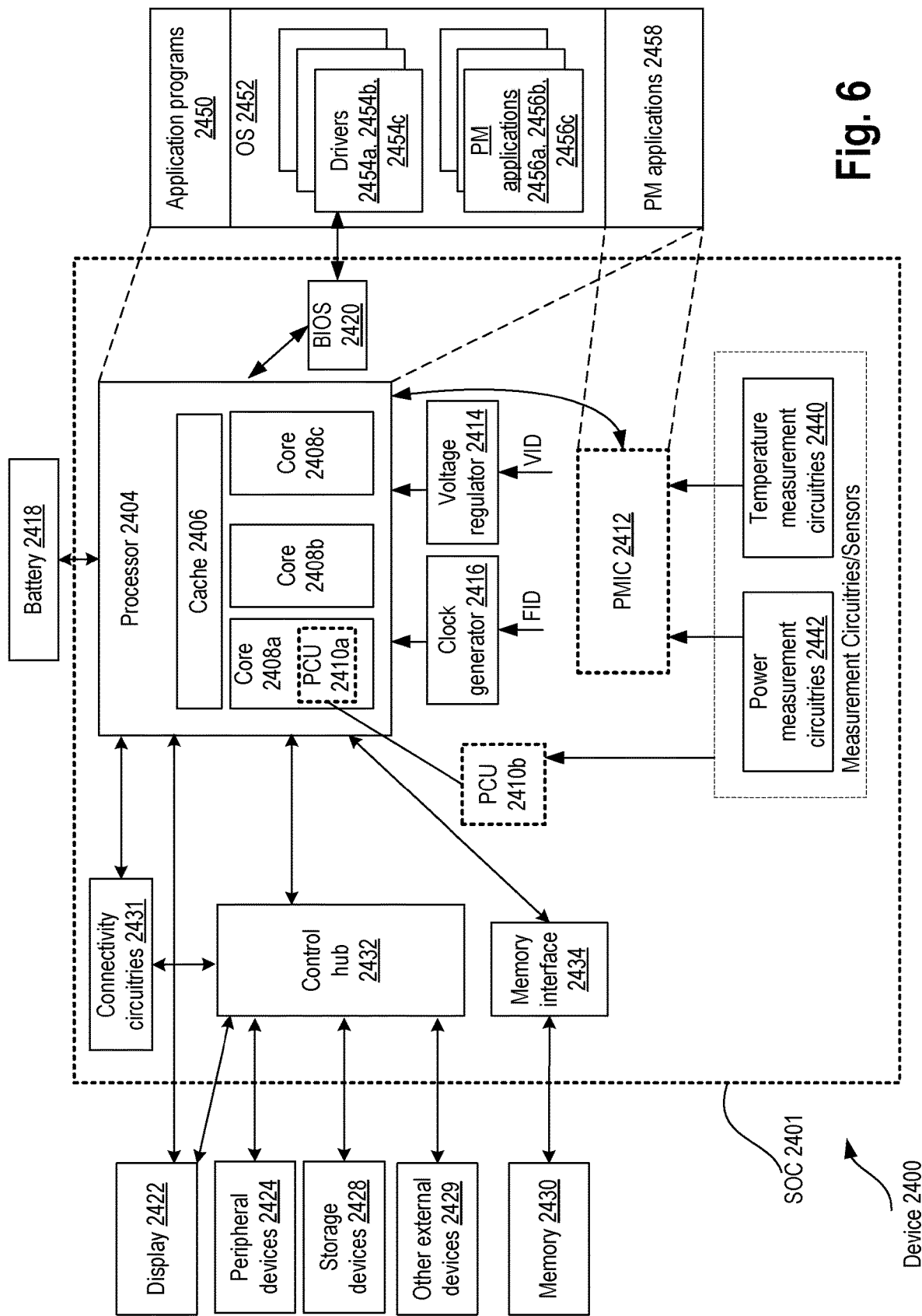

DIGITALLY COORDINATED DYNAMICALLY ADAPTABLE CLOCK AND VOLTAGE SUPPLY APPARATUS AND METHOD

BACKGROUND

Power consumption is an important performance metric from processors. While modern processors include a host of power reduction techniques, there remains opportunity to further reduce power dynamically to further improve performance of the processors.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 6 illustrates a smart device, or a computer system, or a SoC (System-on-Chip) with apparatus to digitally coordinate adaptive clock and voltage in response to latency of operations, according to some embodiments of the disclosure.

DETAILED DESCRIPTION

Figure 1:
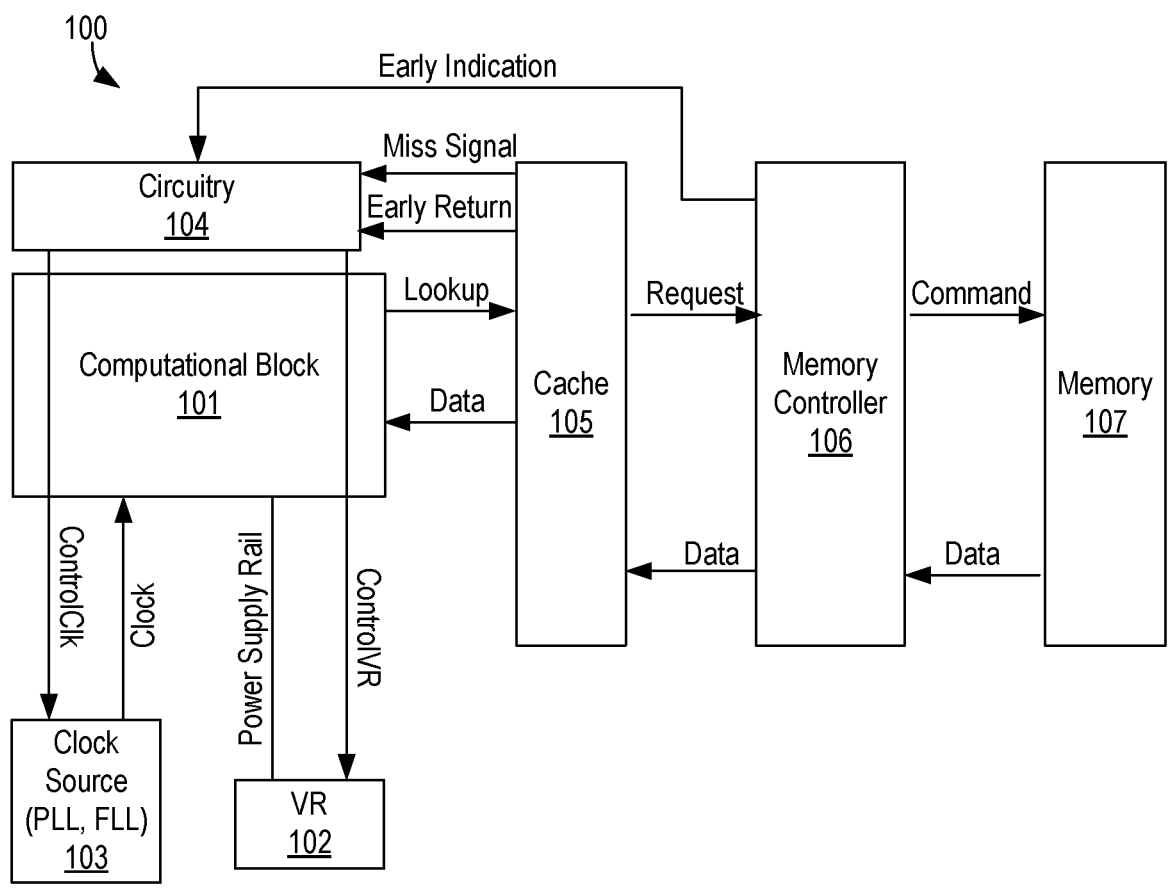
FIG. 1 illustrates an apparatus to digitally coordinate adaptive clock and voltage in response to latency of operations, in accordance with some embodiments.

Modern processors include integrated clock generation and voltage regulation that are designed to provide high-quality stable voltage and frequency supply enabling high frequency of operations irrespectively of the conditions of load of the processor. Advances in the understanding of these workload profiles and technology development, enabling faster reacting integrated voltage regulators and clock generation, allows for coordinating the three (voltage regulators, clock generation sources, and workloads) at a fine granularity. One reason to manage these dynamically at a fine grain is to reduce the power consumption by providing just the right amount of voltage and frequency needed by the program to operate within a performance level at every clock cycle.

Long latency events generate periods of idleness in a processor. In some embodiments, apparatus is provided which throttles down frequency of one or more clocks and power supply voltage to reduce the energy expanded during these reduced activity periods. These reduced activity periods can last tens of nanoseconds. In some embodiments, an early resume indicator is generated a few nanoseconds before normal operations are about to resume. This early resume signal is used to power up a power-downed regulator, and/or can increase frequency and/or supply voltage back to normal level before normal processor operations are about to resume. One type of long latency events is the last-level cache misses and un-cacheable data requests where the data will take tens of nanoseconds to return from main memory to the processor. Typical microprocessor architectures provide early enough notice that data is returning from memory. In some embodiments, a clock generator is provided which enables very fast frequency transition enabling the energy reduction.

There are many technical effects of various embodiments. For example, the apparatus and method of various embodiments allows to reduce significantly (e.g., 3× to 4×) the energy consumed by the processor without impacting its performance. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates apparatus 100 to digitally coordinate adaptive clock and voltage in response to latency of operations, in accordance with some embodiments. Apparatus 100 includes computational block 101, voltage regulator (VR) 102, clock source 103, circuitry 104, cache 105, memory controller 106, and memory 107. Some or all components of apparatus 100 can be on a single die (e.g., system-on-chip), single package with multiple dies, or multiple dies on multiple packages. In some embodiments, computational block 101 is a processor core (e.g., logic block that comprises arithmetic logic unit (ALU), execution units (EUs), schedulers, registers, etc.) which operates on one power domain controlled by VR 102. In some embodiments, computational block 101 comprises multiple power domains, where a separate regulator controls each power domain. For example, the separate regulator controls the voltage level (and/or current level) to the power supply rail of a power domain. In some embodiments, computational block 101 comprises an accelerator for artificial intelligence (AI) processing. For example, computational block 101 comprises a plurality of multiplier arrays coupled to perform multiplications of large numbers. In some embodiments, computational block 101 comprises a processor core of a microprocessor or graphics processor. In some embodiments, computational block 101 is a core logic of a Field Programmable Gate Arrays (FPGA). In some embodiments, computational block 101 is a core logic of a digital signal processor (DSP).

In some embodiments, VR 102 comprises a switching DC-DC voltage regulator. For example, VR 102 is one of a buck converter, boost converter, buck-boost converter. In some embodiments, VR 102 comprises a low dropout (LDO) regulator. Any suitable regulator can be used for VR 102 that can be controlled dynamically to generate different voltage levels on its output power supply rail. The term "dynamic" here generally refers to an automatic function that is performed in real-time with little or no intervention. For example, a certain parameter can be changed adaptively when a system or process is in operation without requiring a power-on sequence or reboot.

In some embodiments, clock source 103 is an adaptive clock source that can dynamically generate a clock with variable clock frequency. In some embodiments, clock source 103 comprises a phase locked loop (PLL). In some embodiments, clock source 103 comprises a frequency locked loop (FLL).

In some embodiments, circuitry 104 processes certain control signals that indicate long latency times for an operation, cache miss (Miss Signal), early indication of data (e.g., Early Indication) being retrieved from memory 107, information of data being found (e.g., Early Return) in cache 105, etc. Circuitry 104 then generates control signals for VR 102 and/or clock source 103 to adaptively change voltage and/or clock frequency to opportunistically reduce power of the computing system. For example, circuitry 104 generates ControlClk signal to adjust frequency of Clock. In some embodiments, circuitry 104 generates ControlVR to control (e.g., reduce) voltage on a Power Supply Rail and/or current output of VR 102. In some embodiments, circuitry 104 operates on an always-on power supply or a power supply that keeps circuitry 104 powered on even when computational block 101 is powered down. In some embodiments, circuitry 104 is part of un-core logic area. In some embodiments, circuitry 104 is part of a power control unit (PCU).

In some embodiments, cache 105 comprises one or more lower-level caches such as L1 cache, L2 cache, L3 cache. Cache 105 can comprise any suitable memory such as dynamic random access memory (DRAM), magnetic random access memory (MRAM), ferroelectric random access memory (FeRAM), resistive RAM (ReRAM), static RAM (SRAM), etc. Computational block 101, upon executing an instruction, may need data to process. That data may be available in cache 105. To address or fetch that data, computational block 101 issues a lookup operation to fetch data from cache 105. If data is not available from cache 105, a Miss Signal is asserted and computational block 101 issues a request to memory controller 106 to find data from memory 107. Memory controller 106 then issues one or more commands (e.g., read command) to find data in memory 107. Memory 107 can be any suitable memory such as dynamic random access memory (DRAM), magnetic random access memory (MRAM), ferroelectric random access memory (FeRAM), resistive RAM (ReRAM), static RAM (SRAM), etc. Once data is located from memory 107, it is propagated to computational block 101.

For long latency events such as last level cache (LLC) misses or un-cacheable requests, it may usually take tens of nanoseconds (e.g., from 30 to hundreds of nanoseconds) for data to return from memory 107 once memory controller 106 sends the request. A modern out-of-order microprocessor may usually continue execution of instructions without the requested data for some time thanks to deep out-of-order buffers. However, in the vast majority of the cases, computational block 101 runs out of independent work that can be executed out-of-order significantly before the data returns from memory 107.

During a period that could last up to hundreds of nanoseconds, depending on the type of access to memory, the processor comprising computational block 101 will be essentially awake but idle. To avoid introduction of a wakeup latency and restart operations as soon as the data returns from memory 107, current processor (computational block 101) is not powered down. As the data returns and the execution resumes, a large spike of current is expected as there will likely be a lot of parallel work that happens in the first few cycles of the data return.

Figure 2A:
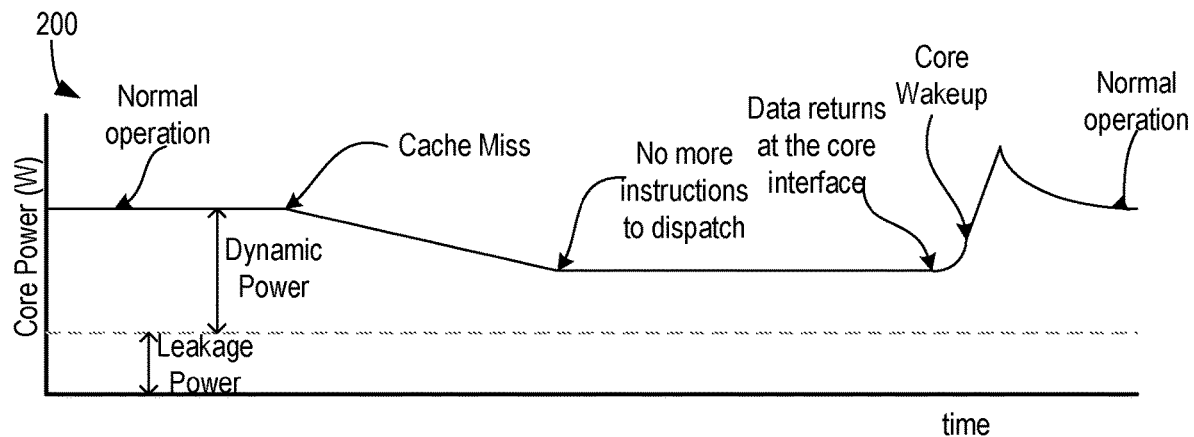
FIG. 2A illustrates a plot showing power profile of a microprocessor during long latency (e.g., cache miss).

FIG. 2A illustrates plot 200 showing power profile of a microprocessor during long latency (e.g., cache miss). Here, x-axis is time and y-axis is core power in Watts (e.g., power of computational block 101). During normal operation of the processor, computational block 101 consumes power comprising of dynamic power and leakage (or static power). Dynamic power is the switching power caused by switching of nodes, which is generally associated with toggling of clock signal. Upon indication of a cache miss, computational block 101 is mostly idle resulting in reduced dynamic or switching power. Once computational block 101 runs out of instructions to execute, dynamic power is wasted with no productive output because computational block 101 is waiting for data to come from memory 107. Upon receiving data from memory 107, a large spike of current is expected as computational block 101 wakes up from idle state to normal operation state.

Referring back to FIG. 1, various embodiments apply clocking schemes for faster and finer grain clock frequency transitions and combine the schemes with advances in integrated power delivery allowing for fast and precise voltage management to synchronize them with architectural events that signal a lowering of activity in the microprocessor. The apparatus of various embodiments synchronously controls at a nanosecond granularity the frequency and voltage of operation of the processor including computational block 101.

In some embodiments, as soon as it becomes known that the last instruction is dispatched in the shadow of a main memory access, the clock frequency of the processor computational block 101 can be significantly reduced as the processor may merely have to process asynchronous events that occur at a low frequency. In some embodiments, such reduction in power is enabled via a digitally controlled clock source FLL or PLL 103, and the expected frequency drop is in the 5×-20× range, for example, to achieve significant dynamic power savings. In parallel, as the frequency of operation drops significantly, the voltage of operations can also be reduced to the minimum required to continue at the very low clock frequency that the processor just transitioned to. This minimum operating voltage is referred to as Vmin, which is the lowest voltage level for a power supply voltage at which computational block 101 can functionally operate and not lose data from its registers. While doing so, in some embodiments, the charge present in the circuit is recycled and stored at the input of the integrated voltage regulator. For example, charge from the load capacitor of VR 102 is stored at the input capacitor of VR 102 to avoid wasting that charge through leakage. In some embodiments, charge on the power supply rail (coupled to the output of VR 102) is shifted or transferred to an input power supply rail (coupled to an input of VR 102). This technique allows for the further reduction in transition energy between operating states of voltage and frequency beyond what is enabled by current integrated voltage regulation.

This lower voltage of operation helps significantly reduce the energy wasted by the processor's (e.g., computational block 101) transistors leakage. As the residual charge in the circuits and on embedded capacitors is fairly high, and the voltage may merely reduce slowly if it is not actively forced down, in some embodiments a charge pump, a buck-boost converter or similar device is used to move that charge back to capacitors located at the input of the processor's voltage regulator. Energy is recycled later once high current operations resume.

In some embodiments, an early signal is generated to allow VR 102 to ramp back up to its initial output voltage on the power supply rail and then the clock frequency goes back to its original point by the time the data returns from memory 107. The advanced signal is used to allow for the transition to happen before the data return triggering the resumption of normal activity such that no time is lost when resuming operations. In the case of data returns from memory 107, such an Early Indication signal is issued very early as when memory controller 106 issues the commands to memory 107. Early Indication signal is generated because the timeliness of the data return from memory 107 is highly predictable and allows enough time for the voltage on the power supply rail to ramp back up. In some embodiments, with a very fast ramping VR 102, it is possible to intercept deterministic information about the data return to still have enough time to wake up without relying on such a predictor in memory controller 107.

In some embodiments, in steady state, clock source FLL (or PLL) 103 operates in closed loop where the FLL clocks are counted and compared against a target then digital codes adjusted as required. Once throttle trigger (or ControlClk) asserts, pre calibrated codes stored in lookup table (e.g., the current digital-to-analog converter (DAC) and/or capacitive tuning codes) are applied to reduce the clock frequency. At the de-assertion, clock source FLL 103 restores the previous close loop codes and close the loop.

Figure 2B:
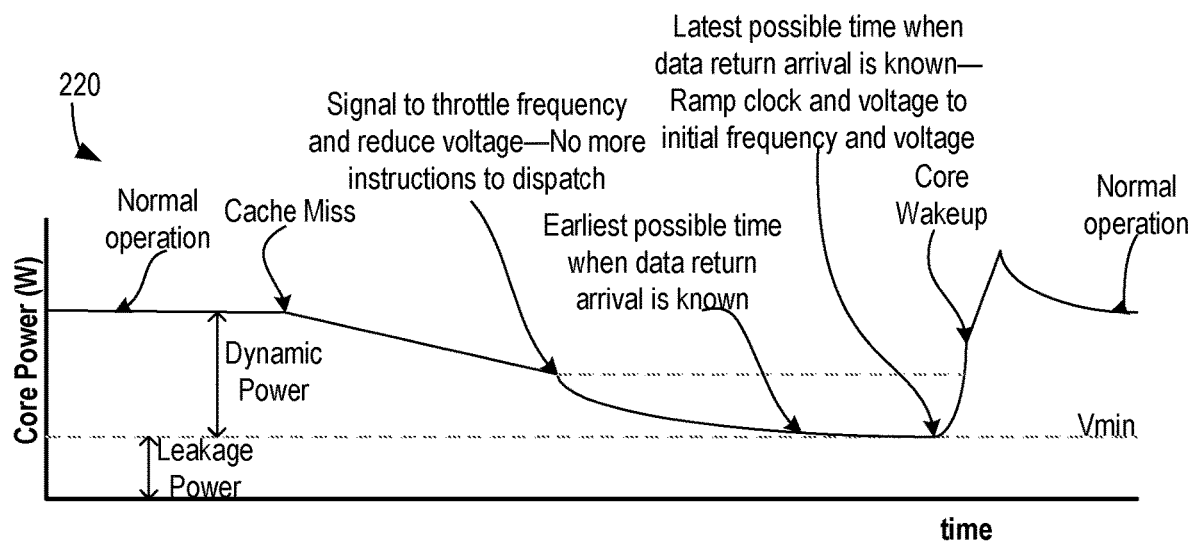
FIG. 2B illustrates a plot showing power profile using digital coordination of adaptive clock and voltage during long latency, in accordance with some embodiments.

FIG. 2B illustrates plot 220 showing power profile using digital coordination of adaptive clock and voltage during long latency, in accordance with some embodiments. Compared to plot 200, here upon cache miss and determination that computational block 101 no longer has instructions to dispatch or execute, circuitry 104 sends ControlClk and/or ControlVR signals to throttle clock frequency and reduce voltage on the power supply rail, respectively. As such, VR 102 and Clock Source 103 reduce voltage and then frequency to reduce power consumption of the processor. This is shown by the core power curve as it dips below the dotted line, which was the core power baseline in plot 200. When circuitry 104 receives an early indication that data from memory 107 is about to return, it informs VR 102 and Clock Source 103 to raise back the output voltage level and the clock frequency to before throttle levels. VR 102 and Clock Source 103 then raise back the output voltage level and the clock frequency to before throttle levels just in time for data to be received by computational block 101 for execution. Core or computational block then wakes up and normal operation continues.

While some embodiments use as an existing trigger signal when both a LLC (lower level cache) miss has been observed and there are no longer instructions to dispatch or execute, this mechanism could be implemented with other triggers. For example, other triggers that are correlated for long consecutive periods of inactivity can be used to represent both confirmed long latency operation in progress and nothing left to execute.

In some embodiments, VR 102 may turn on or dump charge on its output capacitive node when the voltage on the power supply rail is near or close to Vmin level. This ensures that data in registers of computational block 101 remain unaltered. In some embodiments, an hysteretic duty cycle monitor VR 102 may not need to switch at all during the time a processor core is waiting for a long latency data return. In one such embodiment, the hysteretic DCM VR stops switching and its power loss becomes vanishingly small.

In various embodiments, in energy saving mode, the frequency of clock is reduced or throttled first and then power supply to computational block 101 and other circuitries such as cache 105 is reduced. The process is reversed when leaving the energy saving mode and entering the normal mode of operation. For example, when entering normal mode from low energy saving mode, power supply voltage is raised first and then frequency of clock is increased. While the power supply voltage is described as being reduced to Vmin level in the energy saving mode, the level can be programmed by hardware (e.g., fuses, registers) or software (e.g., operating system). For example, the voltage from VR 102 can be set at ½ Vdd (power supply level), ⅔ Vdd, ¾ Vdd, Vmin, etc.

Figure 3:
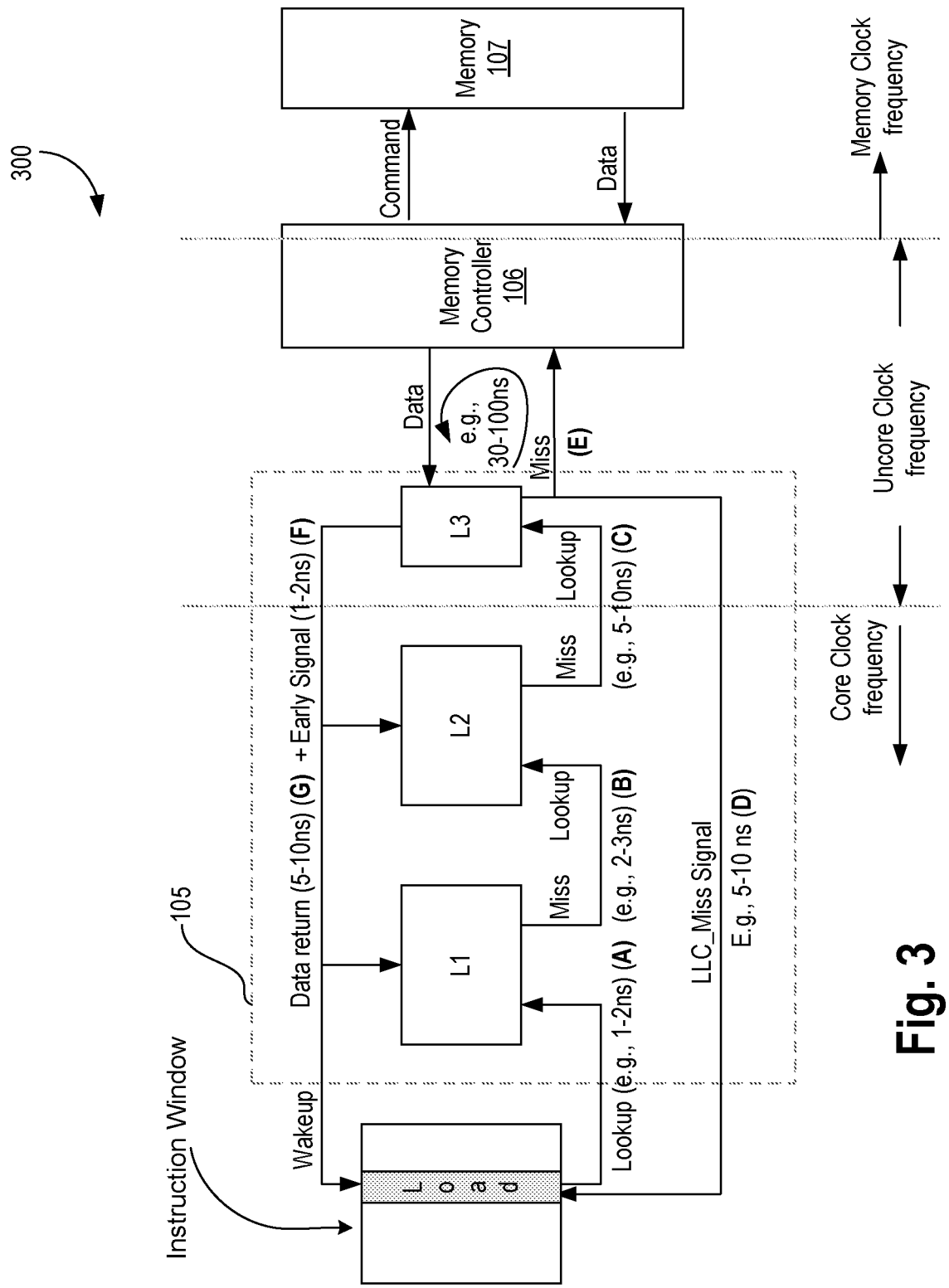
FIG. 3 illustrates a microarchitecture of a cache to digitally coordinate adaptive clock and voltage in response to latency of operations, in accordance with some embodiments.

FIG. 3 illustrates microarchitecture 300 of cache to digitally coordinate adaptive clock and voltage in response to latency of operations, in accordance with some embodiments. Microarchitecture 300 illustrates a case where an instruction is executed by computational block 101 and the load is queried from cache 105. In this example, cache has three levels—L1, L2, and L3. Lookup at the first-level cache L1 is the fastest. For example, lookup of data in L1 takes 1-2 nS (nanoseconds) as indicated by mark (A). If data is not found in L1 cache, a cache miss is indicated and data is looked up in the second-level cache L2. L2 cache takes about 2-3 nS to look up data as indicated by mark (B). If data is not found in L2 cache, another cache miss is indicated and data is looked up in the third-level cache L3 (or last-level cache (LLC)), and so on. In this example, L3 cache takes about 5-10 nS to look up data as indicated by mark (C). If data is not found in L3 cache, Cache Miss signal is asserted and LLC_MISS signal is sent back to computational block 101 as indicated by (D). In this example, latency from initial lookup to receiving the LLC_MISS by computational block 101 is about 5-10 nS.

Upon receiving the miss signal, circuitry 104 or computational block 101 instructs the memory controller 106 to lookup the data from memory 107. The LLC_MISS signal is then sent to memory controller 106. The time it takes for memory controller 106 to command memory 107 to fetch and eventually receive data takes time. This time adds to the overall latency and performance of the processor. For example, it takes about 30 to 100 nS for data to arrive back from memory controller 106 as indicated by (E). The vertical dotted lines indicate the various clock domains. Computational block 101 along with L1 and L2 caches are on processor core (e.g., CPU) clock domain. L3 cache and memory controller 106 are on uncore clock frequency domain while memory 107 is on memory clock frequency domain.

During operations (A), (B), (C), and (D), processor core or computational block 101 keeps dispatching independent instructions. By the time LLC_MISS signal comes back, most of the programs (e.g., 99% of them) have run out of instructions to dispatch. In some embodiments, when LLC_MISS signal is asserted, then apparatus switches to energy saving mode in which circuitry 104 instructs VR 102 and/or clock source 103 to reduce voltage supply level and throttle the frequency.

In the energy saving mode, frequency of the clock can be reduced. For example, divider ratio of clock source 103 can be adjusted on the fly or a new oscillator code can be provided for the oscillator of clock source 103. In some embodiments, in the energy saving mode, voltage level of the voltage on the power supply rail can be reduced. For example, circuitry 104 instructs VR 102 to reduce the duty cycle of its pulse width modulation (PWW) signal that controls the switching activity of high-side and low-side switches of the VR 102. In some embodiments, circuitry 104 instructs VR 102 to transfer charge from its output load capacitor to the input capacitor of an input power supply rail. This is done to save the charge from leaking out. In some embodiments, circuitry 104 instructs VR 102 to configure its output capacitor as a series coupled capacitor from a parallel capacitor configuration. In some embodiments, VR 102 monitors the voltage level of the power supply rail and compares it with a threshold (which is the Vmin or close to Vmin voltage level) and maintains the voltage level at Vmin VR 102 may pump charge into the power supply rail if the voltage on the power supply rail falls below the threshold.

In some embodiments, circuitry 104 receives an early indication that data from memory 107 is being retrieved. This early indication allows circuitry 104 to get VR 102 and/or Clock Source 103 to increase their output voltage and raise their clock frequency, respectively, to pre-throttling level so that computational block 101 is powered up to process the incoming data from memory 107. For example, when early indication signal is received, computational block 101 is woken up before time durations (G) and (F) by a wakeup signal and VR 102 and Clock Source 103 are also adaptively configured to pre-throttling level.

Figure 4A:
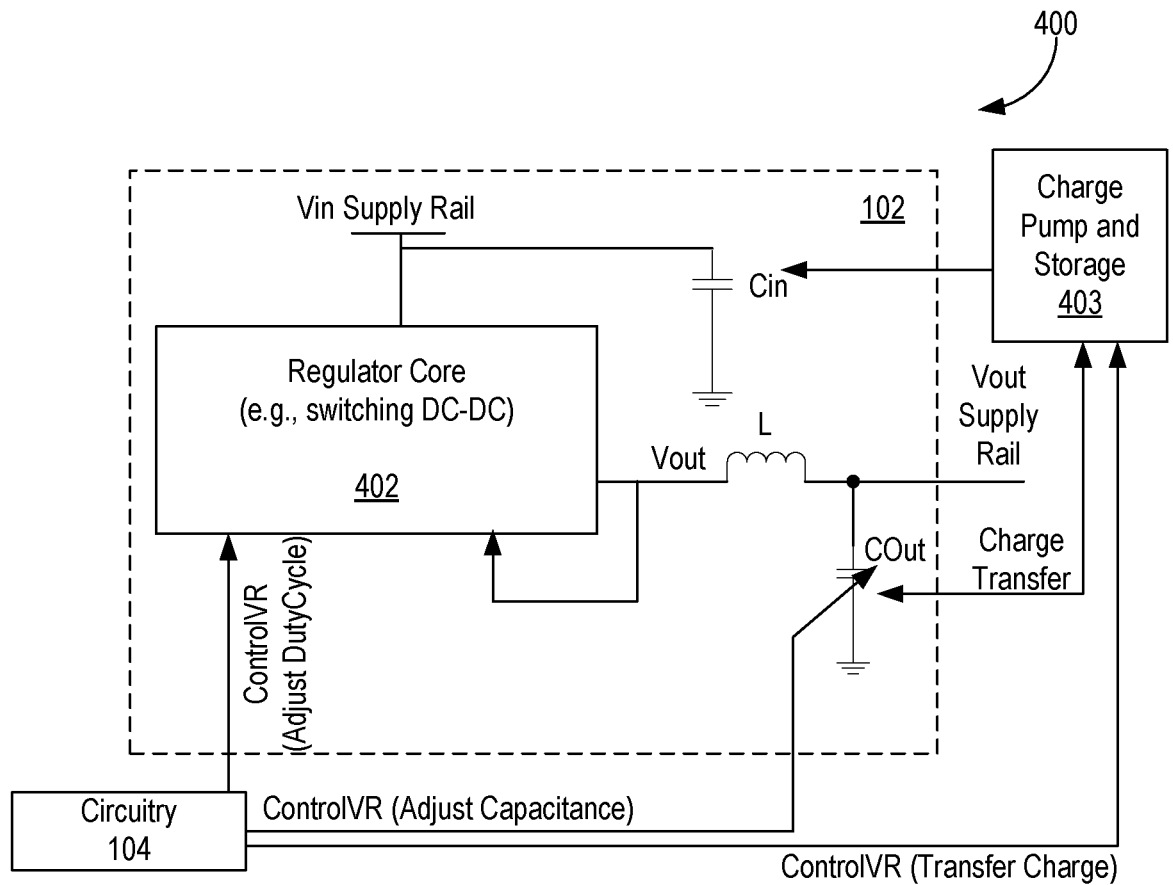
FIG. 4A illustrates an adaptive voltage regulator, in accordance with some embodiments.

FIG. 4A illustrates adaptive VR 400 (e.g., 102), in accordance with some embodiments. In this example, VR 400 is illustrated as a switching DC-DC regulator. The concepts of digitally adapting a voltage level of the power supply rail can be achieved by any suitable regulator. VR 400 comprises regulator core 402 (e.g., high-side switches, low-side switches, PWM, comparator etc.) that receives input supply Vin via Vin Supply Rail and provides a regulated voltage to Vout Supply Rail. The high-side and low-side switches of the Regulator Core are coupled to an output inductor L and capacitor COut as shown.

In some embodiments, Circuitry 104 can use one or more schemes to adjust power supply output of VR 102. For example, during energy saving mode, circuitry 104 asserts one or more ControlVR signals to adjust the voltage level of Vout. In one example, ControlVR signal is used to adjust the duty cycle of PWM signal of regulator core 402. By changing the duty cycle of PWM signal, voltage level of Vout can be lowered or raised.

Figure 4B:
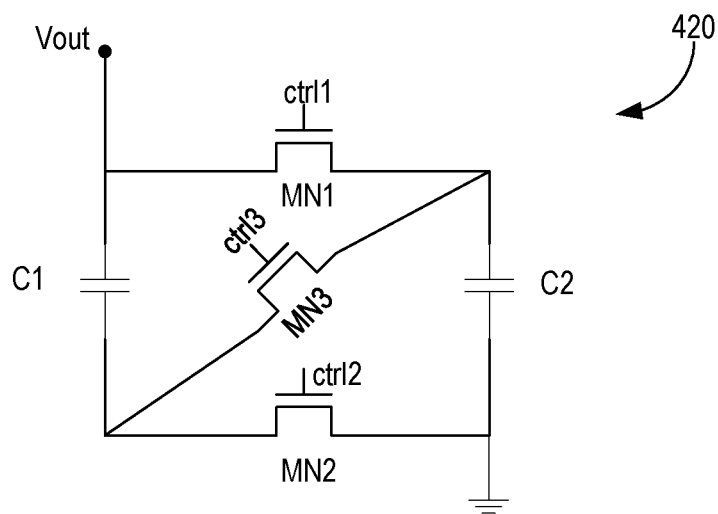
FIG. 4B illustrates a switchable capacitive network to adjust load capacitance of the adaptive voltage regulator, in accordance with some embodiments.

In another example, ControlVR signal from circuitry 104 is used to transfer charge from capacitor COut to the input capacitor Cin coupled to the input Vin Supply Rail. In some embodiments, a charge pump, buck regulator, and/or a storage circuitry is used to store and transfer charge from the output capacitor COut to the input capacitor Cin. In some embodiments, charge from Vout supply rail is transferred to the input capacitor Cin in energy saving mode. This charge is then pumped back to the output supply rail when an early indication is received that data is being retrieved from memory 107. In another example, ControlVR signal from circuitry 104 is used to adjust capacitance of COut by configuring the capacitance of output capacitor COut. FIG. 4B illustrates one such configurable circuit.

FIG. 4B illustrates switchable capacitive network 420 to adjust load capacitance of the adaptive voltage regulator, in accordance with some embodiments. Network 420 comprises capacitors C1 and C2, and transistors MN1, MN2, and MN3 coupled as shown. Transistor MN1 is controlled by control 1 (ctrl1), transistor MN2 is controlled by control 2 (ctrl2), and transistor MN3 is controlled by control 3 (ctrl3). While n-type transistors are shown, the n-type transistors can be replaced with p-type transistors or a combination of n-type and p-type transistors. In some embodiments, circuitry 104 controls signals ctrl1, ctrl2, and ctrl3 to configure capacitors C1 and C2 such that they are coupled in parallel or in series. In some embodiments, during the energy saving mode, circuitry 104 configures the capacitors C1 and C2 of the output capacitor COut to be parallel coupled. In some embodiments, upon exit from the energy saving mode, circuitry 104 re-configures the capacitors C1 and C2 of the output capacitor COut to be series coupled.

Figure 5A:
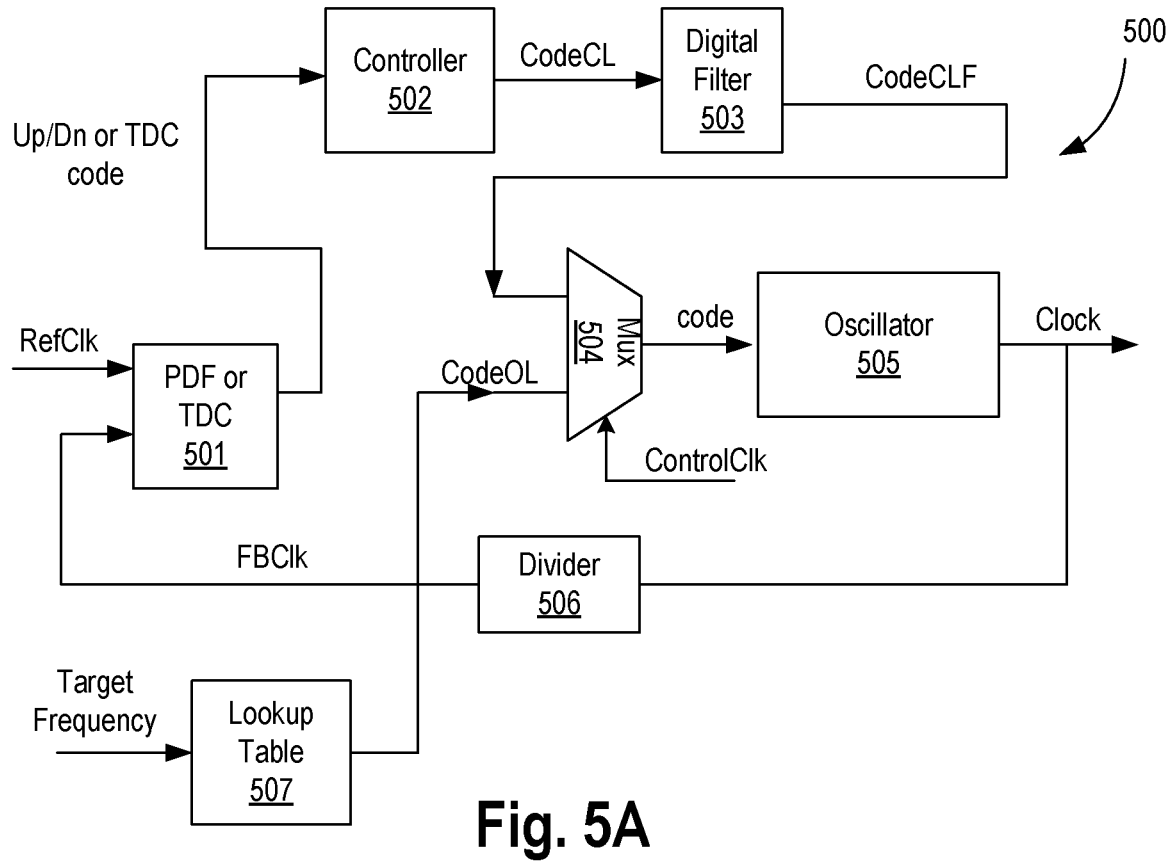
FIG. 5A illustrates a phase locked loop (PLL) or frequency locked loop (FLL) which can generate clock in closed loop or open loop depending on the latency of operations, in accordance with some embodiments.

FIG. 5A illustrates PLL 500 that can generate clock in closed loop or open loop depending on the latency of operations, in accordance with some embodiments. While the embodiment of FIG. 5A illustrates a PLL, the same concept of using open loop and closed loop configurations can be implemented for an FLL. The PLL can be digital, analog, or mixed signal.

PLL 500 comprises phase frequency detector (PFD) or time-to-digital converter (TDC) 501, controller 502, digital filter 503, multiplexer (Mux) 504, oscillator 505, divider 506, and lookup table 507.

In some embodiments, PFD 501 compares reference clock (RefClk) with feedback clock (FBClk) and generates Up and/or Down (Dn) signals. Controller 502 receives these signals to update a digital code CodeCL that controls the frequency of oscillator 505 via digital filter 503. The output of Digital filter 503 is Code CLF. This code can be stored before the FLL or PLL enters into energy saving mode. Controller 502 or Digital filter 503 receives the code when early indication signal is received. In some embodiments, instead of PDF, TDC is used.

TDC 501 receives RefClk and FBClk, and provides a digital stream as output TDCOut that indicates a digital representation of the phase difference between RefClk and FbClk. TDC can comprise a delay line having multiple delay stages (e.g., buffers or inverters), and the output of each delay stage (and input of the first delay stage) is sampled by a flip-flop that uses the reference clock as the sampling clock. The input to the first delay stage in the delay line is the FBClk. As such, RefClk regularly samples the FbClk. The outputs of the flip-flops are then combined to provide the digital stream TDCOut (TDC Code). DLF 503 receives output of TDC (TDCOut). DFL 503 filters any noise in TDCOut using a filter equation. In some embodiments, controller 502 function is implemented in digital filter 503. Filter 503 is implemented using any suitable digital filter such as finite impulse response (FIR), infinite impulse response (IIR) filters. In some embodiments, controller 502 generates Coarse and Fine codes that are control codes for changing the frequency of the Clock from oscillator 505 by large or small amounts.

Oscillator 505 can be digitally-controlled oscillator (DCO). DCO 505 can be any suitable digital oscillator such as a delay line with adjustable loading (e.g., capacitive loading) at the outputs of each delay stage of the delay line. Coarse and/or fine codes can control these adjustable loadings (e.g., added to or subtracted from the loading). In some embodiments, DCO 505 is an inductor-capacitor (LC) oscillator (LCO). In an LCO, the frequency of Clock is adjusted by switching in a variable number of smaller capacitors using coarse and/or fine codes.

Divider 506 receives the output of Clock and divides its frequency by a ratio to generate feedback clock FBClk. In some embodiments, the ratio is an integer. In some embodiments, the ratio is a fraction. In some embodiments, divider 506 is an integer divider. In some embodiments, a sigma-delta modulator implements a fractional divider.

In energy saving mode, FLL 500 or PLL 500 operates in open loop. In one such embodiment, based on a target frequency for Clock, lookup table 507 selects a code for oscillator 505 that sets its frequency to generate the target frequency for Clock. In this example, multiplexer 504 selects the output of lookup table 507 as its output for code. In some embodiments, circuitry 104 controls Multiplexer 504 via ControlClk signal. Upon exit from energy saving mode, when circuitry 104 receives an early indication of data being received from memory 107, ControlClk selects output CodeCLF from digital filter 503 and allows PLL or FLL 500 to operate in closed loop. In some embodiments, previous value of CodeCLF that was saved in a non-volatile memory or memory operating at Vmin (so it does not lose data), is saved back into Digital Filter 503 so PLL or FLL 500 can remain locked. Vmin is the minimum operating voltage below which a logic or circuit does not work properly or reliably.

Figure 5B:
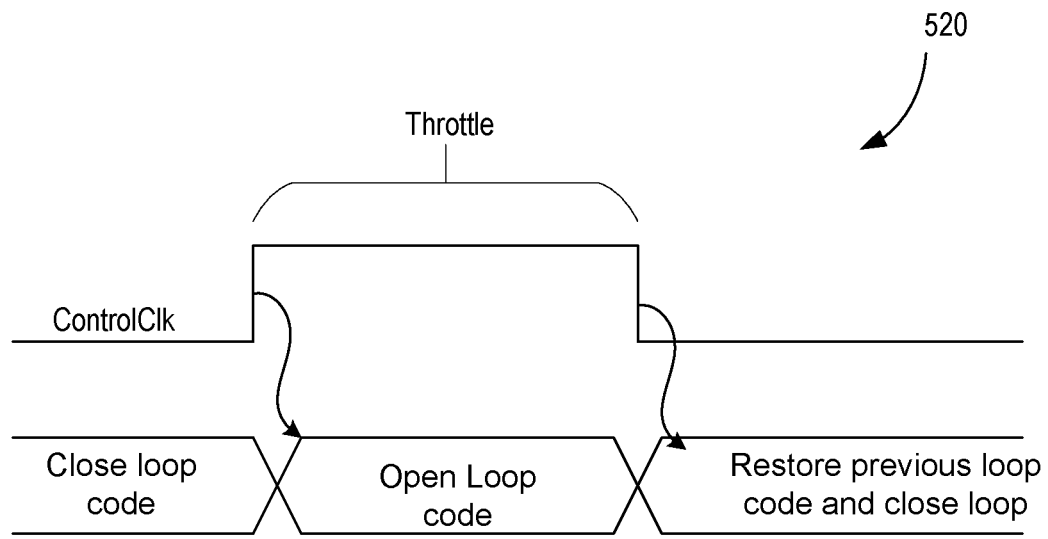
FIG. 5B illustrates a timing diagram of the PLL/FLL output clock frequency throttling, in accordance with some embodiments.

FIG. 5B illustrates timing diagram 520 of PLL output clock frequency throttling, in accordance with some embodiments. Timing diagram 520 describes the function of FLL or PLL 500 in graphical form. During energy saving mode, by operating the FLL or PLL in open loop, FLL or PLL clock frequency is throttled. When the system leaves the energy saving mode, the open loop configuration is changed to closed loop configuration as discussed in FIG. 5A.

FIG. 6 illustrates a smart device, or a computer system, or a SoC (System-on-Chip) with apparatus to digitally coordinate adaptive clock and voltage in response to latency of operations, according to some embodiments of the disclosure.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 15, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 15, the processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2410*a/b* and/or PMIC 2412. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals. Clock generator 2416 is an adaptive clock source that can provide an adaptive frequency output as discussed with reference to various embodiments.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporarily for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a processor core to execute one or more instructions; a voltage regulator coupled to the processor core, wherein the voltage regulator is to provide an adjustable power supply voltage to the processor core; a clock generator coupled to the processor core, wherein the clock generator is to provide an adjustable clock to the processor core; a cache coupled to the processor core; and circuitry to determine whether data to execute the one or more instructions is available from the cache, and to indicate a cache miss if data is not available from the cache, wherein the circuitry is to: instruct the clock generator to reduce frequency of the clock; and instruct the voltage regulator to reduce voltage level of the adjustable power supply, wherein the frequency of the clock is reduced prior to voltage level of the adjustable power supply is reduced.

Example 2

The apparatus of example 1, wherein the circuitry is to instruct the voltage regulator to reduce voltage level of the adjustable power supply to a minimum operative voltage level (Vmin).

Example 3

The apparatus of example 2, wherein the voltage regulator is to monitor its adjustable power supply voltage, and is to increase the voltage level when the voltage level of the adjustable power supply falls below the Vmin.

Example 4

The apparatus of example 1, wherein the voltage regulator comprises: an output capacitor coupled to a power supply rail that provides adjustable power supply voltage to the processor core; and an input capacitor coupled to an input power supply rail that provides input power supply to the voltage regulator, wherein the voltage regulator is to transfer charge from the output capacitor to the input capacitor within a period of indication of a cache miss.

Example 5

The apparatus of example 1, wherein: the voltage regulator comprises a capacitor network with switches coupled to a power supply rail that provides adjustable power supply voltage to a processor core, the capacitor network is to provide series capacitance or parallel capacitance in accordance with a control and coupling of the switches, and if the circuitry is to indicate a cache miss, the capacitor network is to provide parallel coupled capacitors to the power supply rail otherwise the capacitor network is to provide a series coupled capacitors to the power supply rail.

Example 6

The apparatus of example 1, wherein the voltage regulator is to temporarily transfer charge from an output capacitor, coupled to a power supply rail that provides adjustable power supply voltage to the processor core, to an inductor or capacitor within a period of indication of a cache miss.

Example 7

The apparatus of example 1, wherein the clock generator comprises a frequency locked loop (FLL) or a phase locked loop (PLL), wherein the FLL or PLL is to operate in open loop if the circuitry is to indicate a cache miss, otherwise the FLL or PLL is to operate in closed loop.

Example 8

The apparatus of example 1, wherein voltage regulator and the clock generator are to adjust voltage level of the adjustable power supply voltage and frequency of the adjustable clock, respectively, synchronously within a period of indication of a cache miss.

Example 9

The apparatus of example 1, wherein the circuitry is to: provide an early indication that data is available from memory; instruct the clock generator to increase frequency of the clock back to normal level; and instruct the voltage regulator to increase voltage level of the adjustable power supply, wherein the voltage level of the adjustable power supply is increased prior to increase of frequency of the clock.

Example 10

The apparatus of example 9, wherein the early indication is sufficiently early for the voltage regulator and clock generator to adjust the voltage level and frequency, respectively, to an expected level for the processor core execute the one or more instructions.

Example 11

The apparatus of example 9, wherein: the voltage regulator comprises a capacitor network with switches coupled to a power supply rail that provides adjustable power supply voltage to a processor core, the capacitor network is to provide series capacitance or parallel capacitance in accordance with a control and coupling of the switches, and if the circuitry is to provide the early indication, the capacitor network is to provide series coupled capacitors to the power supply rail.

Example 12

The apparatus of example 1 comprises memory controller coupled to the cache.

Example 13

The apparatus of example 12 comprises memory coupled to the memory controller.

Example 14

An apparatus comprising: a voltage regulator to generate a supply voltage; a clock source to generate a clock; a computational block coupled to the voltage regulator and the clock source, wherein the computational block is to receive a supply voltage and a clock; and circuitry to reduce supply voltage and clock frequency within a period less than 100 nanoseconds of a signal that indicates a longer than normal latency operation.

Example 15

The apparatus of example 14, wherein the circuitry is to: provide an early indication that data is available from memory; instruct the clock source to increase frequency of the clock back to pre-reduction level; and instruct the voltage regulator to increase voltage level of the supply voltage to pre-existing supply voltage level, wherein the voltage level of the supply voltage is increased prior to increase of frequency of the clock.

Example 16

The apparatus of example 14, wherein the computational block comprises one or more of: FPGA, processor core, graphics processor core, accelerator, application specific integrated circuit, artificial intelligence processor, or digital signal processor.

Example 17

The apparatus of example 14, wherein the voltage regulator is to temporarily transfer charge from an output capacitor, coupled to a power supply rail that provides \supply voltage to the computational block, to an inductor or capacitor within a period of indication of the signal which represents a longer than normal latency operation.

Example 18

The apparatus of example 14, wherein the clock generator comprises a frequency locked loop (FLL) or a phase locked loop (PLL), wherein the FLL or PLL is to operate in open loop if the circuitry is to indicate the signal which represents a longer than normal latency operation, otherwise the FLL or PLL is to operate in closed loop.

Example 19

A system comprising: a processor core to execute one or more instructions; a cache coupled to the processor core; a memory controller coupled to the processor core; a memory coupled to the memory controller; a voltage regulator coupled to the processor core, wherein the voltage regulator is to provide an adjustable power supply voltage to a processor core; a clock generator coupled to the processor core, wherein the clock generator is to provide an adjustable clock to the processor core; a cache coupled to the processor core; and circuitry to determine whether data to execute the one or more instructions is available from the cache, and to indicate a cache miss if data is not available from the cache, wherein the circuitry is to: instruct the clock generator to reduce frequency of the clock; and instruct the voltage regulator to reduce voltage level of the adjustable power supply, wherein the frequency of the clock is reduced prior to voltage level of the adjustable power supply is reduced; a wireless interface to allow the processor core to communicate with another device.

Example 20

The system of example 19, wherein the circuitry is to instruct the voltage regulator to reduce voltage level of the adjustable power supply to a minimum operative voltage level (Vmin), and wherein the voltage regulator is to monitor its adjustable power supply voltage, and is to increase the voltage level when the voltage level of the adjustable power supply falls below the Vmin.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a processor core to execute one or more instructions;
   a voltage regulator coupled to the processor core, wherein the voltage regulator is to provide an adjustable power supply voltage to the processor core;
   a clock generator coupled to the processor core, wherein the clock generator is to provide an adjustable clock to the processor core;
   a cache coupled to the processor core; and
   control circuitry to determine whether data to execute the one or more instructions is available from the cache, and to indicate a cache miss if data is not available from the cache, wherein the control circuitry is to:
      instruct the clock generator to reduce frequency of the clock based on the indication of the cache miss; and
      instruct the voltage regulator to reduce a voltage level of the adjustable power supply based on the indication of the cache miss, wherein the frequency of the clock is reduced prior to the voltage level of the adjustable power supply being reduced;
      provide an early indication that data is available from memory;
      instruct the clock generator to increase frequency of the clock back to a normal level based on the early indication; and
      instruct the voltage regulator to increase the voltage level of the adjustable power supply based on the early indication, wherein the voltage level of the adjustable power supply is increased prior to increase of frequency of the clock.

2. The apparatus of claim 1, wherein the control circuitry is to instruct the voltage regulator to reduce the voltage level of the adjustable power supply to a minimum operative voltage level (Vmin).

3. The apparatus of claim 2, wherein the voltage regulator is to monitor the adjustable power supply voltage, and is to increase the voltage level when the voltage level of the adjustable power supply falls below the Vmin.

4. The apparatus of claim 1, wherein the voltage regulator comprises:
   an output capacitor coupled to a power supply rail that provides adjustable power supply voltage to the processor core;
   an input capacitor coupled to an input power supply rail that provides input power supply to the voltage regulator; and
   a charge transfer circuit to transfer charge from the output capacitor to the input capacitor within a period of the indication of the cache miss.

5. The apparatus of claim 1, wherein:
   the voltage regulator comprises a capacitor network with switches coupled to a power supply rail that provides adjustable power supply voltage to a processor core,
   the capacitor network is to provide series coupled capacitors or parallel coupled capacitors in accordance with a control and coupling of the switches, and
   based on the indication of the cache miss, the capacitor network is to provide the parallel coupled capacitors to the power supply rail otherwise the capacitor network is to provide the series coupled capacitors to the power supply rail.

6. The apparatus of claim 1, wherein a charge transfer circuitry, coupled to the voltage regulator, is to temporarily transfer charge from an output capacitor, coupled to a power supply rail that provides adjustable power supply voltage to the processor core, to an inductor or another capacitor within a period of the indication of the cache miss.

7. The apparatus of claim 1, wherein the clock generator comprises a frequency locked loop (FLL) or a phase locked loop (PLL), wherein the FLL or PLL is to operate in open loop if the circuitry is to indicate a cache miss, otherwise the FLL or PLL is to operate in closed loop.

8. The apparatus of claim 1, wherein voltage regulator and the clock generator are to adjust voltage level of the adjustable power supply voltage and frequency of the adjustable clock, respectively, synchronously within a period of the indication of the cache miss.

9. The apparatus of claim 1, wherein the early indication is sufficiently early for the voltage regulator and clock generator to adjust the voltage level and frequency, respectively, to an expected level for the processor core execute the one or more instructions.

10. The apparatus of claim 1, wherein:
    the voltage regulator comprises a capacitor network including switches coupled to a power supply rail that provides adjustable power supply voltage to the processor core;
    the capacitor network is to provide series capacitance or parallel capacitance in accordance with a control and coupling of the switches; and
    based on the early indication, the capacitor network is to provide series coupled capacitors to the power supply rail.

11. The apparatus of claim 1, further comprising a memory controller coupled to the cache and the memory.

12. An apparatus comprising:
a voltage regulator to generate a supply voltage;
a clock source to generate a clock;
a computational block coupled to the voltage regulator and the clock source, wherein the computational block is to receive a supply voltage and a clock; and
control circuitry to reduce the supply voltage and a frequency of the clock within a period less than 100 nanoseconds of a signal that indicates a longer than normal latency operation, wherein the control circuitry is further to:
provide an early indication that data is available from a memory;
instruct the clock source to increase frequency of the clock back to pre-reduction level; and
instruct the voltage regulator to increase voltage level of the supply voltage to a pre-existing supply voltage level, wherein the voltage level of the supply voltage is increased prior to increase of frequency of the clock.

13. The apparatus of claim 12, wherein the computational block comprises one or more of: FPGA, processor core, graphics processor core, accelerator, application specific integrated circuit, artificial intelligence processor, or digital signal processor.

14. The apparatus of claim 12, wherein the voltage regulator is to temporarily transfer charge from an output capacitor, coupled to a power supply rail that provides supply voltage to the computational block, to an inductor or capacitor within a period of indication of the signal which represents a longer than normal latency operation.

15. The apparatus of claim 12, wherein the clock generator comprises a frequency locked loop (FLL) or a phase locked loop (PLL), wherein the FLL or PLL is to operate in open loop if the circuitry is to indicate the signal which represents a longer than normal latency operation, otherwise the FLL or PLL is to operate in closed loop.

16. An apparatus comprising:
a processor core to execute one or more instructions;
a voltage regulator coupled to the processor core, wherein the voltage regulator is to provide an adjustable power supply voltage to the processor core;
a clock generator coupled to the processor core, wherein the clock generator is to provide an adjustable clock to the processor core;
a cache coupled to the processor core; and
control circuitry to determine whether data to execute the one or more instructions is available from the cache, and to indicate a cache miss if data is not available from the cache, wherein the circuitry is to:
instruct the clock generator to reduce frequency of the clock; and
instruct the voltage regulator to reduce voltage level of the adjustable power supply, wherein the frequency of the clock is reduced prior to voltage level of the adjustable power supply is reduced; and
charge transfer circuitry coupled to the voltage regulator, wherein the charge transfer circuitry is to temporarily transfer charge from an output capacitor, coupled to a power supply rail that provides adjustable power supply voltage to the processor core, to an inductor or another capacitor within a period of the indication of the cache miss.

17. The apparatus of claim 16, wherein the another capacitor is an input capacitor coupled to an input power supply rail that provides input power supply to the voltage regulator.

* * * * *